United States Patent
Kim

(10) Patent No.: US 11,256,235 B1
(45) Date of Patent: Feb. 22, 2022

(54) COMPUTER AUTOMATIC ASSEMBLY SYSTEM

(71) Applicant: Ki-Beom Kim, Asan-si (KR)

(72) Inventor: Ki-Beom Kim, Asan-si (KR)

( * ) Notice: Subject to any disclaimer, the term of this patent is extended or adjusted under 35 U.S.C. 154(b) by 0 days.

(21) Appl. No.: 17/242,967

(22) Filed: Apr. 28, 2021

(30) Foreign Application Priority Data

Feb. 4, 2021 (KR) ........................ 10-2021-0015777

(51) Int. Cl.
*G05B 19/418* (2006.01)
*B65G 47/90* (2006.01)
(Continued)

(52) U.S. Cl.
CPC ..... *G05B 19/41805* (2013.01); *B65G 47/905* (2013.01); *H05K 13/04* (2013.01); *H05K 13/0812* (2018.08); *G05B 2219/31323* (2013.01); *G05B 2219/45064* (2013.01); *Y10T 29/49131* (2015.01); *Y10T 29/53174* (2015.01)

(58) Field of Classification Search
CPC .............. H05K 13/04; H05K 13/0404; H05K 13/0406; H05K 13/0812; H05K 13/0813; G05B 16/41805; G05B 19/4183; G05B 19/4185; G05B 19/41865; G05B 2219/31036; G05B 2219/31053; G05B 2219/31286; G05B 2219/31304; G05B 2219/31323; G05B 2219/36195; G05B 2219/45064; B65G 47/905; Y10T 29/49131; Y10T 29/53087; Y10T 29/53091; Y10T 29/53174; Y10T 29/53178; Y10T 29/53265

See application file for complete search history.

(56) References Cited

U.S. PATENT DOCUMENTS

2016/0366797 A1* 12/2016 Sumi ................... H05K 13/0857
2017/0023931 A1* 1/2017 Sanji ................... G05B 19/4185

FOREIGN PATENT DOCUMENTS

JP 09160622 A 6/1997
JP 11285936 A 10/1999
(Continued)

*Primary Examiner* — Peter Dungba Vo
*Assistant Examiner* — Joshua D Anderson
(74) *Attorney, Agent, or Firm* — Novick, Kim & Lee, PLLC; Jae Youn Kim

(57) ABSTRACT

A computer automatic assembly system is proposed. The computer automatic assembly system includes: a database for storing information of an assembly and mounting area of a part combined to a mainboard, and program information such as information of a BIOS, a driving driver, and an operating system, and periodically updating the corresponding information through a communication part including a wired/wireless communication network; a device digestive module for checking the part through a photographing means, moving the checked part to the assembly and mounting area of the part provided on the mainboard through the photographing means and a robot arm for transfer, assembling, and mounting the part, and then writing a driving program and circuit information of the part; and an administrator terminal for periodically upgrading or updating part information necessary for the device digestive module by a part company server through a communication network including the wired/wireless communication network.

5 Claims, 12 Drawing Sheets

(51) Int. Cl.
    *H05K 13/08*     (2006.01)
    *H05K 13/04*     (2006.01)

(56) References Cited

FOREIGN PATENT DOCUMENTS

| | | |
|---|---|---|
| JP | 2010-188459 A | 9/2010 |
| KR | 10-1997-0064341 A | 9/1997 |
| KR | 10-2009-0001679 A | 1/2009 |
| KR | 10-1298459 B1 | 8/2013 |

\* cited by examiner

COMPUTER AUTOMATIC ASSEMBLY SYSTEM

CROSS REFERENCE TO RELATED APPLICATION

The present application claims priority to Korean Patent Application No. 10-2021-0015777, filed Feb. 4, 2021, the entire contents of which is incorporated herein for all purposes by this reference.

BACKGROUND OF THE INVENTION

Field of the Invention

The present invention relates to a computer automatic assembly system and, more particularly, to a computer automatic assembly system in which parts necessary for configuring a computer are automatically assembled on a mainboard where computer parts are assembled, general users as well as businesses may easily implement desired computer specifications by providing circuit information and software (i.e., device driver, firmware, application, etc.) necessary for operating the assembled parts, and booting time of an operating system may be reduced as there is no need for compatibility checking and initial setup of the assembled parts.

Description of the Related Art

As is known, a computer refers to various types of electronic engineering automatic devices that are assembled with various parts and solve problems by processing input data according to a predetermined method, and refers to a device that processes various kinds of data by using electronic circuits.

Among the most commonly used computers, a personal computer (PC) used by an individual includes: hardware that is a physical part; and software that is a program for operating the hardware and related data, wherein the general configuration and features of each of hardware and software is as follows.

(1) Hardware

Central Processing Unit (CPU)

A central processing unit receives, analyzes, and processes data from an input device and a memory device, and is often abbreviated as a CPU. The central processing unit is a core part that corresponds to the brain of a computer and greatly influences the overall performance of the computer. In addition, in most cases, the price of the central processing unit is often the most expensive one among the parts of the computer.

Main Memory Unit

A main memory unit is a device that stores data to be processed by the central processing unit, wherein a semiconductor is often used therein. The main memory unit includes: a ROM in which once data is recorded, the data is saved and remains even when power is turned off; and a RAM in which the data may be written or erased, but all the data disappears when the power is turned off. Unless a special-purpose computer is to be used, most main memory units use a RAM.

Secondary Memory Unit

A RAM, which is mainly used as a main memory unit, has a fast data processing speed, but memory capacity is small, and when the power is turned off, data is erased. A secondary memory unit serves a role of complementing such a main memory unit. The secondary memory unit is relatively slow to write or erase data compared to the main memory unit, but the data may be safely stored even when the power is turned off. Recently, an HDD having large memory capacity and an SSD having relatively fast speed have been used as the secondary memory unit. In addition, a USB memory, which is easy to carry, is also widely used, whereas a CD-ROM, which is an optical storage, is gradually being phased out of use in computers today.

Input Device

An input device refers to a device used to input various data or commands in order to use a computer. A keyboard, a mouse, and a joystick are representative input devices, and recently, a digital camera, a scanner, and a microphone are also being used. Meanwhile, an input device for a mobile device includes: a touch screen that is both an input device and an output device; and a stylus pen that is an electronic input device used for detailed control of the touch screen.

Output Device

An output device serves a role as a device substantiating information processed by a central processing unit and delivering the information to a user, and typically, a monitor, a speaker, a printer, and the like belong to the category of the output device.

In addition, a mainboard, a motherboard, a main circuit board, a base board, a planar board, or a system board is a board having a main circuit embedded in electronic devices such as computers. Such a board is a kind of essential main part used in expandable electronic devices such as computers, and refers to a printed circuit board (PCB) that is an electronic board provided with an input/output port and a circuit for integrating and connecting various cables or wires, the printed circuit board providing interfaces that enables the connecting of peripheral devices and the mounting of major parts, such as a CPU or a RAM, for system operation.

In many cases, a mainboard of a personal computer primarily includes a sound card and a network card, and depending on use purpose, there are cases where a CPU, a RAM, and a secondary memory unit are also embedded in the mainboard.

In order to mount parts, such as a central processing unit, a main memory, and a secondary memory unit of computer hardware, on the mainboard, there is inconvenience in that an operator has to manually mount the parts, one by one, on each mounting area. In addition, since the inconvenience occurs equally for both an individual assembling a computer himself or herself or a company assembling the computer, there is a problem in that an automation process is difficult to be realized.

In addition, as technology is developed, even though parts are the same kind, a problem of pin mismatch has occurred due to changes in the structure of connectors and the method of communication, and also, as electrical interfaces and protocols are changed, there is a problem in that the parts are unable to be physically mounted or the parts are not recognized even though the parts are mounted on the mainboard.

As an example, referring to a PCIe (peripheral component interconnect express) slot that is a data transmission standard provided on a mainboard and used when combining devices for function expansion, the PCIe slot is an interface developed as a standard for a serial communication method due to the technical limitation of a PCI bus, wherein the bandwidth varies according to the version and the number of lanes, and the physical connector structure is formed differently.

In other words, the first generation of PCIe having one lane has a bandwidth of 250 MB/s and a data rate of 2.5 GT/s, and the third generation of PCIe having eight lanes has a bandwidth of 7.88 GB/s and a data rate of 8 GT/s.

In addition, although PCIe slots are compatible regardless of the version thereof, since the length of a physical connector changes depending on the number of lanes, PCIe devices with a small number of lanes may be combined in slots with a large number of lanes, whereas PCIe devices with a large number of lanes may not be combined in slots with a small number of lanes.

Here, the lane is configured to transmit and receive packets, and when two or more lanes are aggregated and made into one link, communication speed may be increased by the number of lanes, thereby the more the number of lanes, the higher the communication speed, eventually.

As described above, the PCIe slots are compatible regardless of the versions thereof, but there is a problem in that coupling is limited due to the structure of the physical connector, and resulting from this problem, there is another problem in that the coupling of PCIe devices that a user desires to use is limited due to the lanes of the PCIe slot provided on the mainboard.

(2) Software

Operating System

An operating system is the most important software that manages the overall computer system. As for an operating system, since all hardware and application software, which constitute a computer, serve a role through the operating system, the overall computer performance, functions, and compatibility may vary depending on the nature of the operating system. Depending on target devices, such an operating system includes Windows, macOS, Linux, and the like for PCs, and iOS, Android, and the like for mobile devices.

Application Program

An application program is called as an application in short, and the application program broadly refers to all software except the operating system. The application programs have a wide variety of types, including: office software such as word processors and spreadsheets; and multimedia software such as games and video players. Except in some cases, most application software is often designed to run only on a specific operating system.

Meanwhile, booting refers to a series of processes in which when a user presses a start button to apply power to hardware in order to use a computer, the operating system operates on the computer so as to reach a state waiting for a user's next command.

Describing the above booting process roughly, the booting process proceeds in sequence as follows: checking computer power→checking and initializing a CPU→checking and initializing a RAM→checking and initializing other plugged devices→uploading an operating system stored in a memory device to the RAM→controlling devices by the operating system (OS)→outputting a required GUI and waiting for a user command. Up to the process of uploading the operating system stored in the memory device to the RAM, the software stored in the ROM built into the mainboard and called Firmware or BIOS (i.e., basic input/output system: this is actually a customary term and firmware has a more accurate meaning) is responsible for the processes to be performed.

In addition, a process of passing information of the devices checked while uploading the operating system to the RAM and checking all plug devices including the CPU is called POST (power on self-test), and the POST is performed by comparing the process with a part's normal operating scenario previously stored in the ROM.

In such processes, even though all of the hardware compatibility mentioned above matches, how to enable the operating system to use given devices is a separate matter. Since it is not possible to input all use cases of each device into the operating system, a framework is constructed in which the operating system may operate, and in line with the constructed framework, a device manufacturer develops the software called a device driver so that the operating system may utilize the device well.

When such a device driver is installed in the operating system, proper commands (including recognition of a device) are transmitted to the device so that the device is able to operate normally. Accordingly, when a user purchases a specific device, he or she must install an appropriate device driver in order to use the corresponding device smoothly in a computer.

As an example, in a case where a company called KKB manufactures a PCIe interface-based device, intends to operate the manufactured device in Linux, and attempts to use an open command in the struct file_operations defined as a framework in Linux in advance when the device is recognized, when implementing a desired function by generating a function called KKB_open( ) and connecting the function to a device driver in a form of "file_operations KKB_fops={.open=KKB_open};", the KKB_open( ) is executed at a time when the corresponding device is recognized in Linux, thereby recognizing the device as intended by the company called KKB.

In order to use the device smoothly or to operate the device smoothly as described above, the device driver should be installed by a user.

In addition, for smooth control of the device, when necessary, an application program, the firmware to be stored in the ROM of the mainboard, or even the firmware that should be built into a product may be installed on the device. In this case, the compatibility and configuration that the user should consider becomes more complex.

DOCUMENTS OF RELATED ART (Patent Document 1) Korean Patent Application Publication No. 10-2016-0142CA3 (published on Dec. 13, 2016)

(Patent Document 2) Korean Patent No. 10-1298459 (registered on Aug. 13, 2013)

(Patent Document 3) Korea Patent Application Publication No. 10-1997-0064341 (published on Aug. 12, 1997)

(Patent Document 4) Korea Patent Application Publication No. 10-2009-0001679 (published on Jan. 9, 2009)

SUMMARY OF THE INVENTION

When a computer part is determined, a mainboard of a computer may use only the computer part that satisfies physical specifications and electrical interfaces of the mainboard by combining the computer part. In order to actually use the corresponding part, sometimes a device driver, an application program, and various firmware, which are for solving software compatibility problem, are required so as to allow the operating system of the user to recognize the corresponding part. The limitation of such standards and interfaces has the following problems: ① Users are required to be familiarized themselves with and manage physical standards, electrical interfaces, and software compatibility. ② When a new computer-part product that the user needs to use does not satisfy the compatibility with the existing mainboard, the user is forced to replace the existing mainboard and the computer part. ③ A mainboard manufacturer is forced to produce a new mainboard whenever the computer part is changed.

Accordingly, the present invention is to solve all the disadvantages and problems of the related art as described above, and an objective of the present invention is to provide a computer automatic assembly system in which processes are performed automatically, the processes including: providing an assembly area for assembling computer parts necessary for configuring a computer on a mainboard where the computer parts are assembled; photographing a part to be mounted or assembled in the assembly area through a photographing means; specifying the corresponding part; and mounting or assembling the corresponding part after transferring the corresponding part to the assembly area through the photographing means and a robot arm for transfer.

In addition, another objective of the present invention is to provide a computer automatic assembly system in which by providing a BIOS, a driving driver, and an application program required for an assembled part, the operating system may recognize and use the assembled part and the user's burden of setting the driver for the assembled part may be eliminated, and the booting speed may be improved in a way of checking the operation of the assembled part by a DDM (device digestive module) in advance and enabling the checking of the operation of the assembled part to be omitted during a booting process of the operating system.

In addition, the position (i.e., height) of a female pin provided in a slot is adjusted through a pin adjuster so as to physically correspond to a male pin provided in a part to be assembled. In addition, in order to meet electrical compatibility that is the rest aspect of a physical layer, analog circuit information of a connector corresponding to the part is received from the device digestive module and programmed into a FPAA (field-programmable analog array). Then, in order to meet compatibility of a data link layer or digital protocol, digital circuit information is received from the device digestive module and programmed into a FPGA (field-programmable gate array). In this way, after it has been confirmed that both structural and electrical compatibility have been achieved, in order for the operating system to recognize the assembled part, the driver of the corresponding part is provided by the device digestive module, or is downloaded and installed from a manufacturer or a supplier through a communication means connected on the basis of a unique ID (i.e., part number, device ID, part name, etc.) of the part recognized through the identified information, so that when the part to be assembled is disposed on a part placement table by a user, a subsequent procedure for using the part is automatically proceeded, whereby in addition to improving convenience of the assembly, it is possible to assemble and use the part without considering compatibility only when the part for computer performance desired by the user is ready to use, it is possible for the user not to perform an initial setup, and it is possible for the user to easily assemble the part without special knowledge of the computer assembly and the part even when adding or removing the part for controlling the computer performance.

In order to achieve the objectives, the present invention provides a computer automatic assembly system including: a database for storing information of an assembly and mounting area of a part combined to a mainboard, and program information such as information of a BIOS, a driving driver, and an operating system, and periodically updating the corresponding information through a communication part including a wired/wireless communication network; a device digestive module for checking the part through a photographing means, moving the checked part to the assembly and mounting area of the part provided on the mainboard through the photographing means and a robot arm for transfer, assembling, and mounting the part, and then writing a driving program and circuit information of the part; and an administrator terminal for periodically upgrading or updating part information necessary for the device digestive module by a part company server through a communication network including the wired/wireless communication network.

In addition, the device digestive module may include: an EDM (electrical digestion module) for receiving the circuit information of the part, the BIOS, the driving driver, and an operating program from the database and writing the received circuit information in the assembly and mounting area of the part; and a controller for controlling operations of an MDM (mechanical digestion module) that controls operation of the robot arm for transfer, the database, the photographing means, the MDM, the EDM, and the communication part.

In this case, the robot arm for transfer may transfer the part to the assembly and mounting area of the mainboard, may assemble or mount the transferred part in the assembly and mounting area of the mainboard, photographs a transfer process and an assembly or mounting status through a camera, and may transmit the transfer process and the assembly or mounting status to the administrator terminal.

In addition, the photographing means may include: a plurality of cameras; and a part placement table provided in a photographing range of each camera and on which the assembled part is disposed.

In addition, the administrator terminal may be either an administrator computer capable of performing wired or wireless communication or a smart phone capable of performing the wireless communication.

The present invention as described above has an effect in that when assembling a part, necessary for configuring a computer, on a mainboard where computer parts are assembled, each part being assembled on the mainboard is automatically identified through a photographing means (i.e., camera), and each corresponding part may be transferred to a corresponding position on the mainboard through a robot arm for transfer and then assembled on the mainboard, whereby automatic assembly of computer parts is possible.

In addition, the present invention has an effect in that when assembling a computer part, circuit information that matches the combined part is provided through a device digestive module in which circuit information about the part is provided, the combined part is able to be operated by changing a variable circuit of an assembly and mounting area so as to match the provided circuit information, the information on an operation status of the verified part is provided to the device digestive module, and the device digestive module may omit a verification procedure for normal operation of the part in the process of operating the operating system.

In addition, the present invention has an effect in that especially when booting the operating system, a central processing unit, a RTC (real-time clock or system clock), a video component, a process of testing of all drives connected to a system, and a process of voltage conversion for compatibility are not required, a process of POST (power on self-test) is not required, and when a user desires to enter BIOS, a verification procedure for the configuration may be omitted from a boot program because the user is able to enter the BIOS by connecting a monitor, a keyboard, and a mouse to a bus controller, whereby the booting time of the operating system may be shortened.

In addition, when assembling a computer part, necessary software may be immediately loaded through the device digestive module, and when the necessary software is not built in the device digestive module, the software that is distributed online through the Internet may be installed immediately.

BRIEF DESCRIPTION OF THE DRAWINGS

FIGS. 4 to 9 are exemplary views showing a direction of each cross section shown in FIG. 3, wherein FIG. 4 is an exemplary view showing a cross-sectional direction of number 1 shown in FIG. 3, showing a lane that may be connected to another computer automatic assembly system, and showing an exhaust outlet provided for air discharged from a fan.

FIG. 5 is an exemplary view showing a cross-sectional direction of number 2 shown in FIG. 3, showing a lane that may be connected to another computer automatic assembly system, and showing an assembly and an assembly and mounting area of a mainboard.

FIG. 6 is an exemplary view showing a cross-sectional direction of number 3 shown in FIG. 3, showing that a pin adjuster is embedded under the assembly and mounting area of the mainboard, and showing connector ports, such as a USB and a HDMI, are positioned on the lane that may be connected to another computer automatic assembly system on the right side so that a user may use a computer.

FIG. 7 is an exemplary view showing a cross-sectional direction of number 4 shown in FIG. 3, showing the fan for cooling on the left side, and showing a space on the top in which a robot arm for transfer, controlled through an MDM, installs a part.

FIG. 8 is an exemplary view showing a cross-sectional direction of number 5 shown in FIG. 3 and showing a modulator area, which is an area where the robot arm for transfer actually moves, in addition to an area occupied by the lane that may be connected to another computer automatic assembly system.

FIG. 9 is an exemplary view showing a cross-sectional direction of number 6 shown in FIG. 3 and showing the exhaust outlet provided for air discharged from the fan.

DETAILED DESCRIPTION OF THE INVENTION

Figure 1:
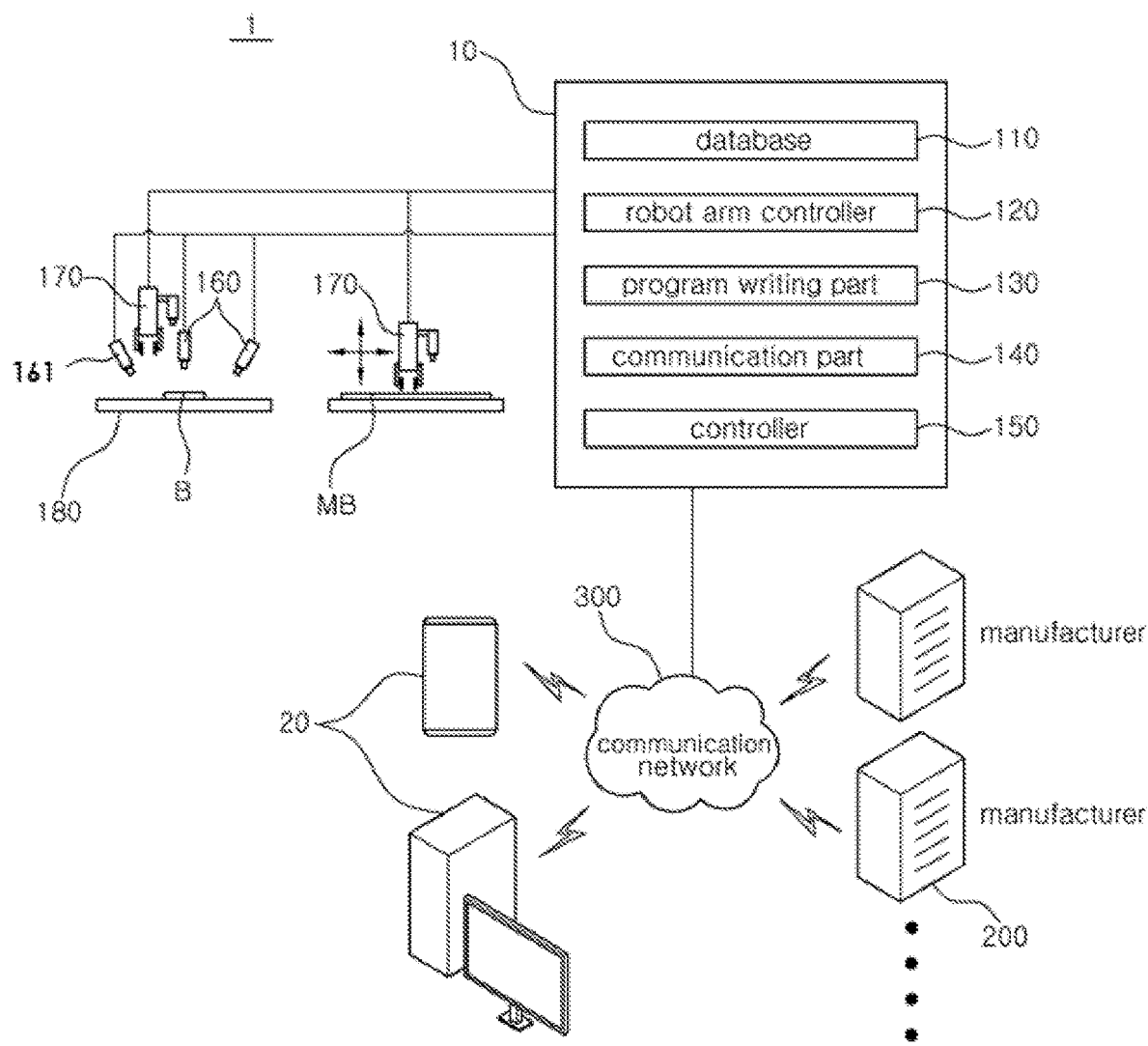
FIG. 1 is an exemplary view showing an exemplary embodiment of a computer automatic assembly system according to the present invention.

Hereinafter, in addition to the above objectives, other objectives and features of the present invention will be clearly revealed through the description of the exemplary embodiments with reference to the accompanying drawings.

Unless otherwise defined, all terms including technical and scientific terms used herein have the same meaning as commonly understood by one of ordinary skill in the art to which the present invention belongs. It will be further understood that terms as defined in dictionaries commonly used herein should be interpreted as having a meaning that is consistent with their meaning in the context of this specification and the relevant art and will not be interpreted in an idealized or overly formal sense unless expressly so defined herein.

Hereinafter, a preferred exemplary embodiment of a computer automatic assembly system according to the present invention will be described with reference to the accompanying drawings.

The computer automatic assembly system 1 according to the present invention includes: a database 110 for storing assembly and mounting area information of a part to be combined to a mainboard and program information such as a BIOS, a driving driver, and operating system information, and in which the corresponding information is periodically updated through a communication part 140 including a wired/wireless communication network;

a device digestive module 10 for checking a part through a photographing means 160, moving the checked part to the assembly and mounting area Z of the part provided on the mainboard MB through the photographing means 160 and a robot arm 170 for transfer controlled by an MDM (mechanical digestion module) 120, assembling and mounting the part, and writing a driving program and circuit information of the part; and an administrator terminal 20 for periodically upgrading or updating part information required for the device digestive module 10 by a manufacturer server 200 through a communication network 300 including the wired/wireless communication network.

The device digestive module 10 includes the database 110, the photographing means 160, the MDM 120, an EDM 130, the communication part 140, and a controller 150.

The database 110 stores information of an assembly and mounting position of the part combined in the mainboard and information of the BIOS, the driver, and the operating program. The information is periodically updated by the administrator terminal 20 or the manufacturer server 200.

For example, in the database 110, circuit information for electrical connection and operation of the part to be combined is stored, and the stored circuit information is periodically updated through operation information of the combine part or through the communication network 300. In this case, the operation information of the combined part may be stored when a shutdown command of the operating system is executed while power is applied to the mainboard, or may be configured to be automatically stored every predetermined time. The periodic update through the communication network 300 periodically checks and stores circuit information of the part provided by a manufacturer through a wired/wireless communication network when the operating system is operated.

Meanwhile, the database 110 may receive the stored BIOS, driving driver, and operating program through communication with the administrator terminal 20. This functionality may be realized by means of the administrator terminal being capable of performing wired/wireless communication, having a relatively long power-on time compared to that of the computer that is assembled according to the present invention, collecting information about parts from time to time from manufacturers, and transmitting the collected information through a local area network such as Bluetooth provided in the operating system.

The photographing means 160 is for photographing a part B disposed on a part placement table 180 to check unique identification information of the corresponding part B, and such a photographing means 160 includes a plurality of cameras 161 and is disposed to be able to photograph the part placement table 180 from various angles.

In addition, the part placement table 180 is a component on which the part to be combined stands by, and although there is no particular limitation on the shape and size of the part placement table 180, it is preferable that the top surface on which the part is placed is formed in a flat plate shape.

The MDM (mechanical digestion module) 120 controls the robot arm 170 for transfer which transfers and combines a corresponding part to the assembly and mounting area Z provided on the mainboard after the identifying of the part photographed through the photographing means 160 is completed.

Such an MDM 120 controls the lifting and movement of the robot arm for transfer, and also checks the assembly or mounting position of the part through the camera separately provided in the robot arm for transfer. The video or image captured for checking is transmitted to the administrator terminal 20 in real time.

The relationship between configuration and operation of the MDM 120 and the robot arm 170 for transfer is used in a known automated process, and a detailed description and illustration thereof will be omitted.

The EDM (electrical digestion module) 130 receives circuit information on a part to be combined in the assembly and mounting area Z from the database 110, controls a configurable circuit of the assembly and mounting area Z, and simultaneously adjusts the height of a female pin constituting the assembly and mounting area Z through a pin adjuster (not shown in the drawing).

The communication part 140 notifies a status of work or occurrence of work abnormality to the administrator terminal or the operating system, and at the same time periodically receives information of the BIOS, driver, and circuit for a part from a manufacturer, so as to transmit the information to the database 110, thereby providing a communication environment for updating the corresponding information.

In addition, the communication part 140 periodically checks the BIOS, driving driver, and operating program for the part from the manufacturer. In a case where information received from the manufacturer is a higher version than the information stored in the database 110, the manufacturer's information is transmitted to the database 110 and updated, whereas in a case where the information received from the manufacturer is a higher version than the information being used in the part combined in the current assembly and mounting area Z, an update is performed by transferring whether to perform the updating of the BIOS, driving driver, and operating program for the corresponding part to the administrator terminal or the operating system.

Figure 2:
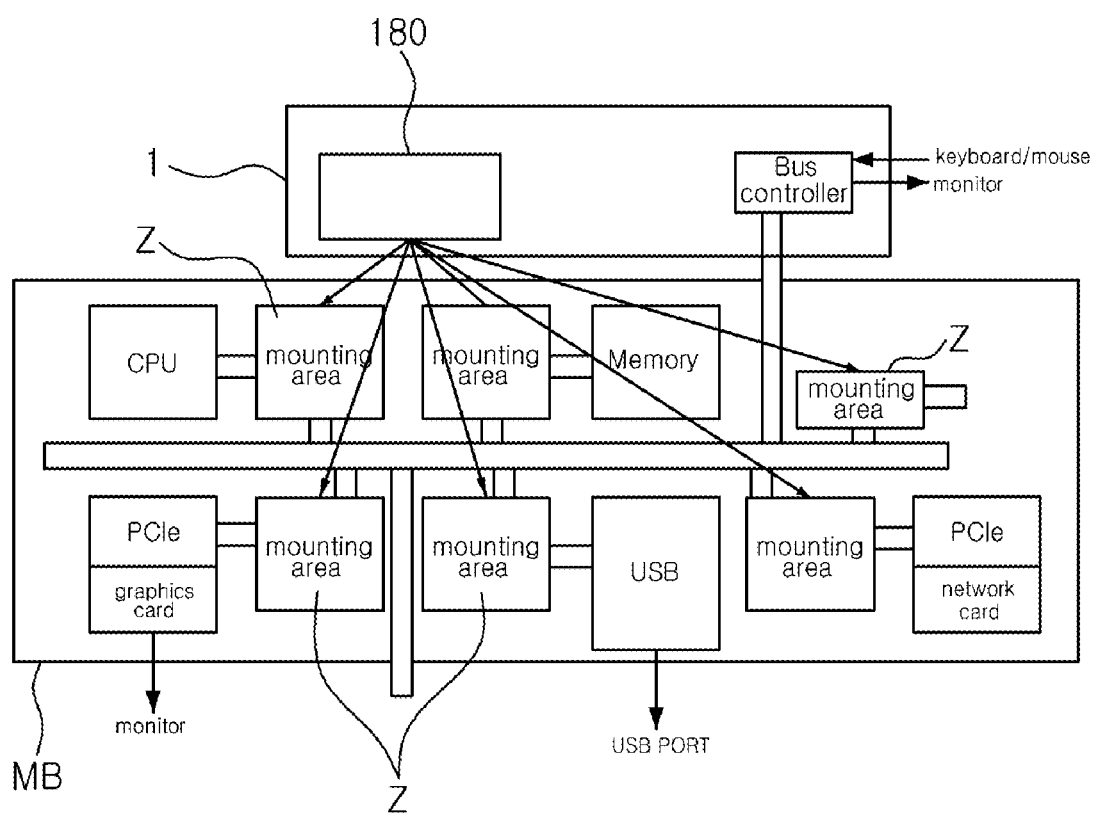
FIG. 2 is an exemplary view showing an exemplary embodiment of the computer automatic assembly system according to the exemplary embodiment of the present invention.

The controller 150 controls the database 110, the photographing means 160, the MDM 120, the EDM 130, and the communication part 140 (refer to FIG. 2).

Meanwhile, the controller 150 is provided with an optical character recognition program (OCR) for specifying the part photographed through the photographing means 160, so that unique identification information (i.e., model name, S/N, manufacturer, etc.) for the part is identified from a video or an image captured by the photographing means 160, and information matching the identified unique identification information is transmitted to the EDM 130 after the BIOS, driving driver, and operating program is called from the database 110.

FIG. 2 is a view for explaining in more detail the mounting of parts on the mainboard in the computer automatic assembly system according to the exemplary embodiment of the present invention.

In the computer automatic assembly system according to the exemplary embodiment of the present invention, as in FIG. 2, in the mounting of the parts on the mainboard, the parts including a CPU, a memory, a graphics card, an Ethernet card that is a network card, and a USB port are mounted on the mainboard, and for each part, a program required for operation is recorded (i.e., written), on the basis of circuit (i.e., part) information on a configurable circuit, in the database 110 where circuit information (i.e., program information) suitable for the type of each part is stored.

In this case, each part (i.e., CPU, memory, graphics card, network card, etc.) is specified by extracting the unique identification information of the corresponding part after the corresponding part information is photographed by the camera, and mounted or assembled in the assembly and mounting area by the robot arm for transfer.

Each part communicates through a central bus and a communication line, receives signals from a keyboard or a mouse, and outputs screens to a monitor.

In addition, the information on an operation state of the mounted or assembled part is transmitted to the database 110 after being acquired by the operating system, and is updated as the information on the corresponding part.

Figure 3:
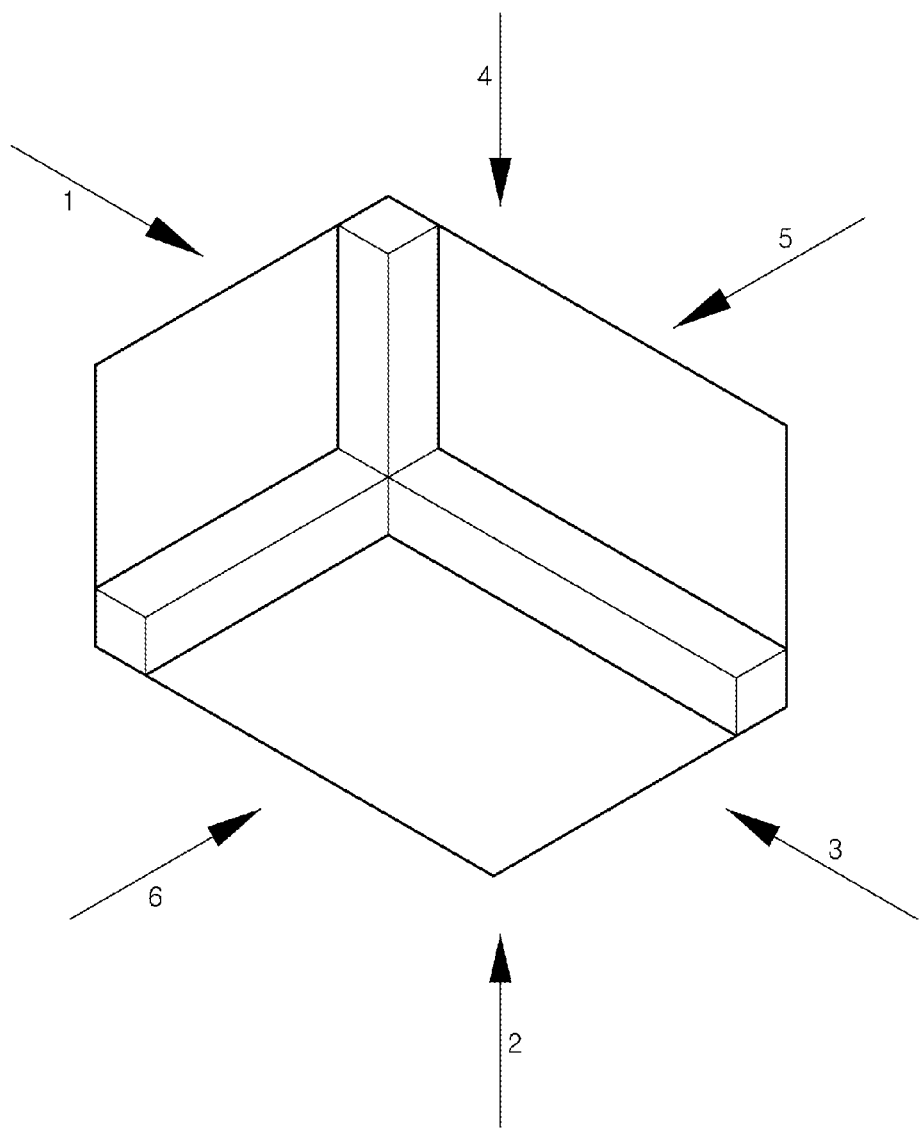
FIG. 3 is a schematic diagram for indicating a number on each cross section of a three-dimensional form and showing the three-dimensional form of the automatic computer assembly system according to the present invention.
Figure 4:
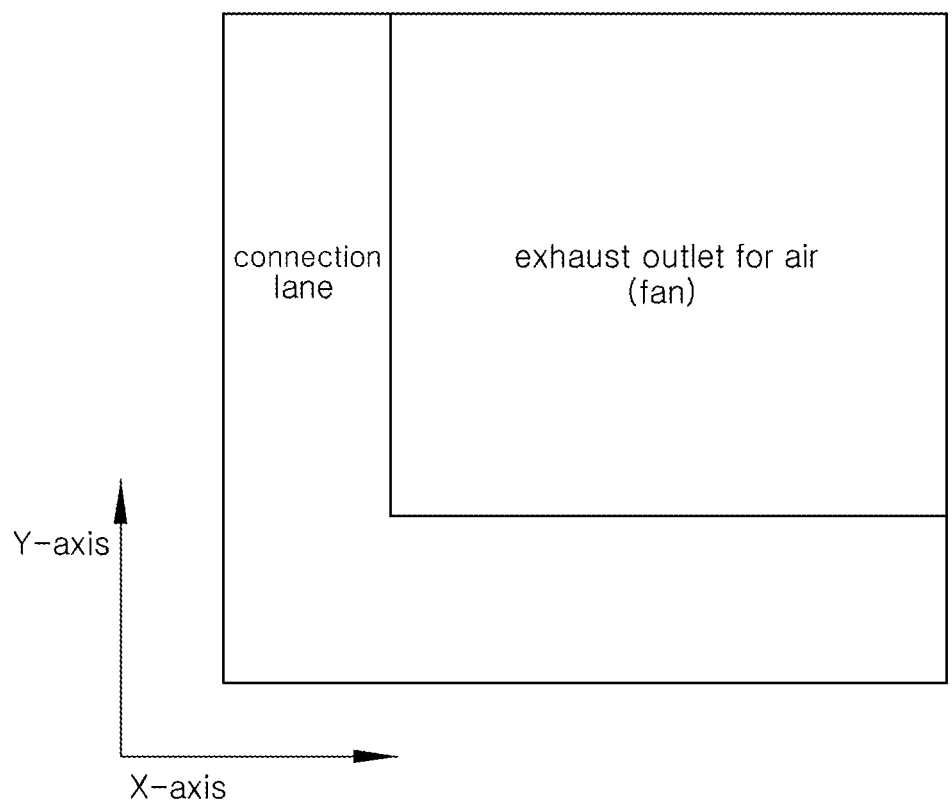
Figure 5:
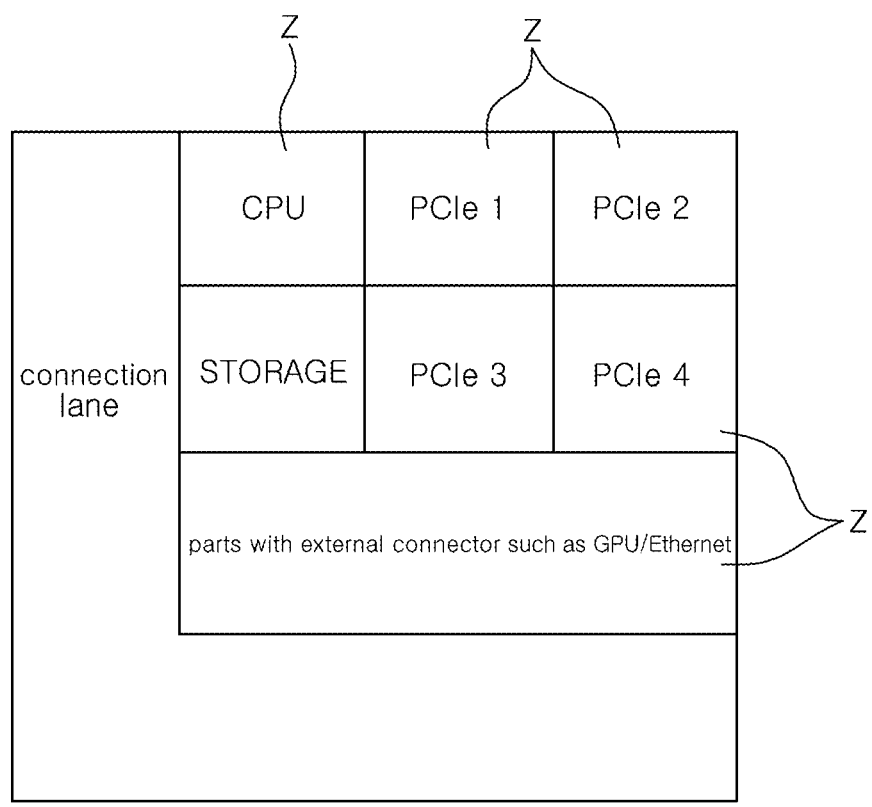
Figure 6:
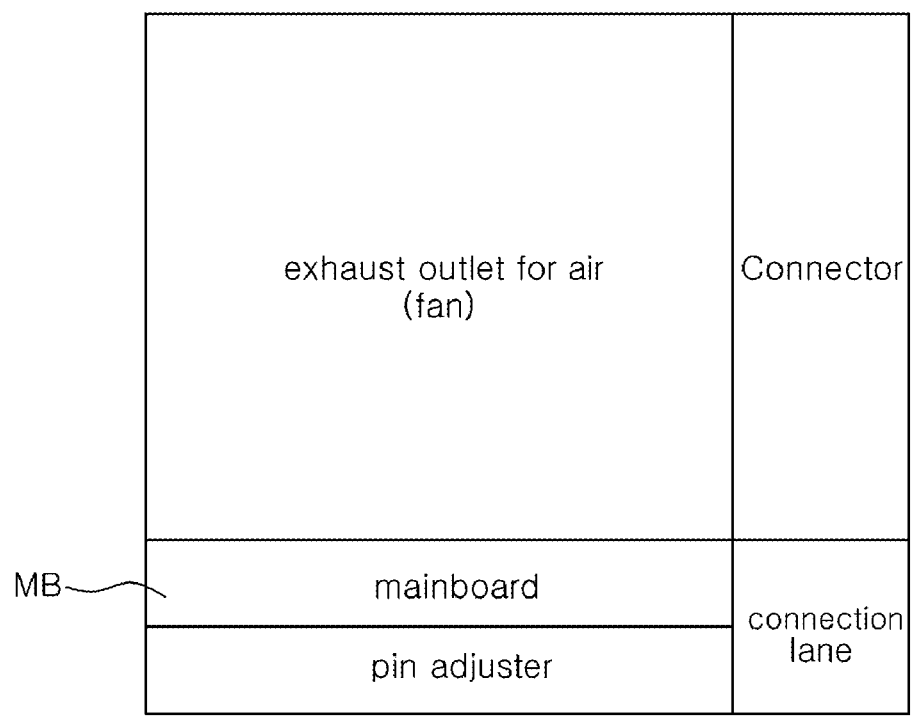
Figure 7:
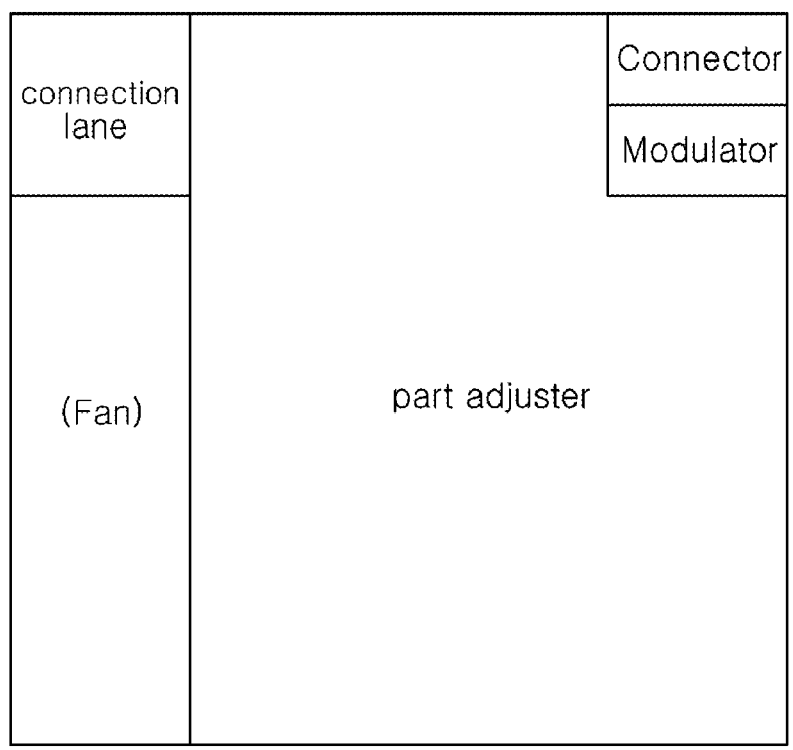
Figure 8:
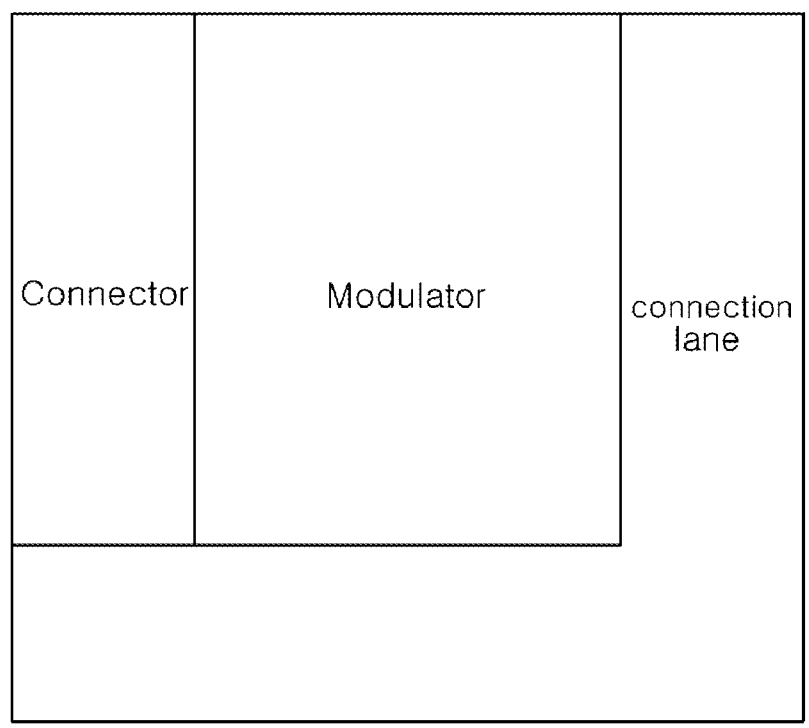
Figure 9:
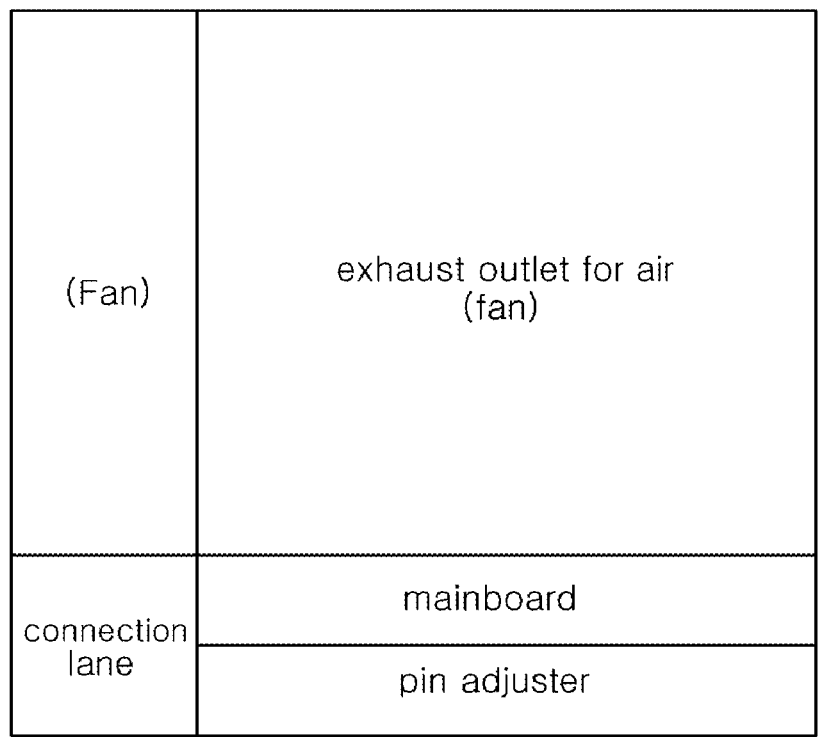

FIG. 3 is a schematic diagram for indicating a number on each cross section of a three-dimensional form and showing the three-dimensional form of the automatic computer assembly system according to the present invention. FIGS. 4 to 9 are exemplary views showing a direction of each cross section shown in FIG. 3. FIG. 4 is an exemplary view showing a cross-sectional direction of number 1 shown in FIG. 3, showing a lane that may be connected to another computer automatic assembly system, and showing an exhaust outlet provided for air discharged from a fan. FIG. 5 is an exemplary view showing a cross-sectional direction of number 2 shown in FIG. 3, showing a lane that may be connected to another computer automatic assembly system, and showing an assembly and an assembly and mounting area of a mainboard. FIG. 6 is an exemplary view showing a cross-sectional direction of number 3 shown in FIG. 3, showing that a pin adjuster is embedded under the assembly and mounting area of the mainboard, and showing connector ports, such as a USB and a HDMI, are positioned on the lane that may be connected to another computer automatic assembly system on the right side so that a user may use a computer. FIG. 7 is an exemplary view showing a cross-sectional direction of number 4 shown in FIG. 3, showing the fan for cooling on the left side, and showing a space on the top in which a robot arm for transfer, controlled through an MDM, installs a part. FIG. 8 is an exemplary view showing a cross-sectional direction of number 5 shown in FIG. 3 and showing a modulator area, which is an area where the robot arm for transfer actually moves, in addition to an area occupied by the lane that may be connected to another computer automatic assembly system. FIG. 9 is an exemplary view showing a cross-sectional direction of number 6 shown in FIG. 3 and showing the exhaust outlet provided for air discharged from the fan.

Among the drawings for explaining a computer assembled by the computer automatic assembly system according to the present invention, a diagram for understanding the assembly or mounting position of a part of the computer is as shown in FIG. 3, and each number is for describing a mainboard or a computer body, or the mounting of the part in the directions of arrows in FIGS. 4 to 9 to be described later.

First, FIG. 4 is an exemplary view showing a cross-sectional direction of number 1 shown in FIG. 3, showing a lane that may be connected to another computer automatic assembly system, and showing an exhaust outlet provided for air discharged from a fan.

As shown in FIG. 4, a connecting lane is provided in the X-axis direction on the bottom surface of the mainboard and in the Y-axis direction perpendicular to one side surface of the mainboard. In other words, in the present invention, when a computer body stands upright, the connection lane that electrically transmits signals or data to one side surface perpendicular to the horizontal bottom surface is provided. A fan is disposed in the computer body, and the fan operates by the power and signals applied from the mainboard. In the area where the fan is installed, temperature inside the computer body is controlled by circulating air inside thereof with the outside.

In addition, FIG. 5 is an exemplary view showing a cross-sectional direction of number 2 shown in FIG. 3, showing a lane that may be connected to another computer automatic assembly system, and showing an assembly and an assembly and mounting area of a mainboard. When viewed from the direction of number 2 in FIG. 3, it is shown that a connecting lane is provided in one side of a floor and the other side of the floor, that is, in the X-axis and Y-axis directions, and the other area is provided as the assembly and mounting area of the mainboard.

Here, the assembly and mounting area Z includes separated areas such as a CPU and DRAM area, a hard disk area, other part area (i.e., PCIe 1 to PCIe 4), and a connector installation area where a graphic card, an Ethernet card, and the like are mounted, or a monitor or the Internet are connected thereto, but the areas are not limited thereto, and various exemplary embodiments may be possible in which the number of PCIe slots is changed. Therefore, it is apparent that the illustrated form in the drawings is not limited thereto.

Meanwhile, FIG. 6 is an exemplary view showing a cross-sectional direction of number 3 shown in FIG. 3, showing that a pin adjuster is embedded under the assembly and mounting area of the mainboard, and showing connector ports, such as a USB and a HMI, are positioned on the lane that may be connected to another computer automatic assembly system on the right side so that a user may use a computer. As viewed from the direction of number 3 in FIG. 3, it shows that a pin adjuster is provided on the bottom of the computer body, and the computer body is composed of a mainboard, a Y-axis connection lane, a connector connection area, and an exhaust outlet of air, which are provided at the upper part of the pin adjuster.

In addition, FIG. 7 is an exemplary view showing a cross-sectional direction of number 4 shown in FIG. 3, showing the fan for cooling on the left side, and showing a space on the top in which a robot arm for transfer, controlled through an MDM, installs a part. On one side, a Y-axis connection lane is provided and a fan installation area through which air is discharged is provided on the one side thereof, and the other area is a part adjuster area that looks like an empty space. Such a part adjuster area is a space where an installation position of the part is checked by the photographing means and the robot arm for transfer installs the part while grabbing and moving the part.

For the photographing and movement of the photographing means and the movement of the robot arm for transfer, the signals or data are transmitted to and received from the photographing means and the robot arm for transfer, through the bus controller.

In addition, FIG. 8 is an exemplary view showing a cross-sectional direction of number 5 shown in FIG. 3 and showing a modulator area, which is an area where the robot arm for transfer actually moves, in addition to an area occupied by the lane that may be connected to another computer automatic assembly system, and FIG. 9 is an exemplary view showing a cross-sectional direction of number 6 shown in FIG. 3 and showing the exhaust outlet provided for air discharged from the fan.

Figure 10A:
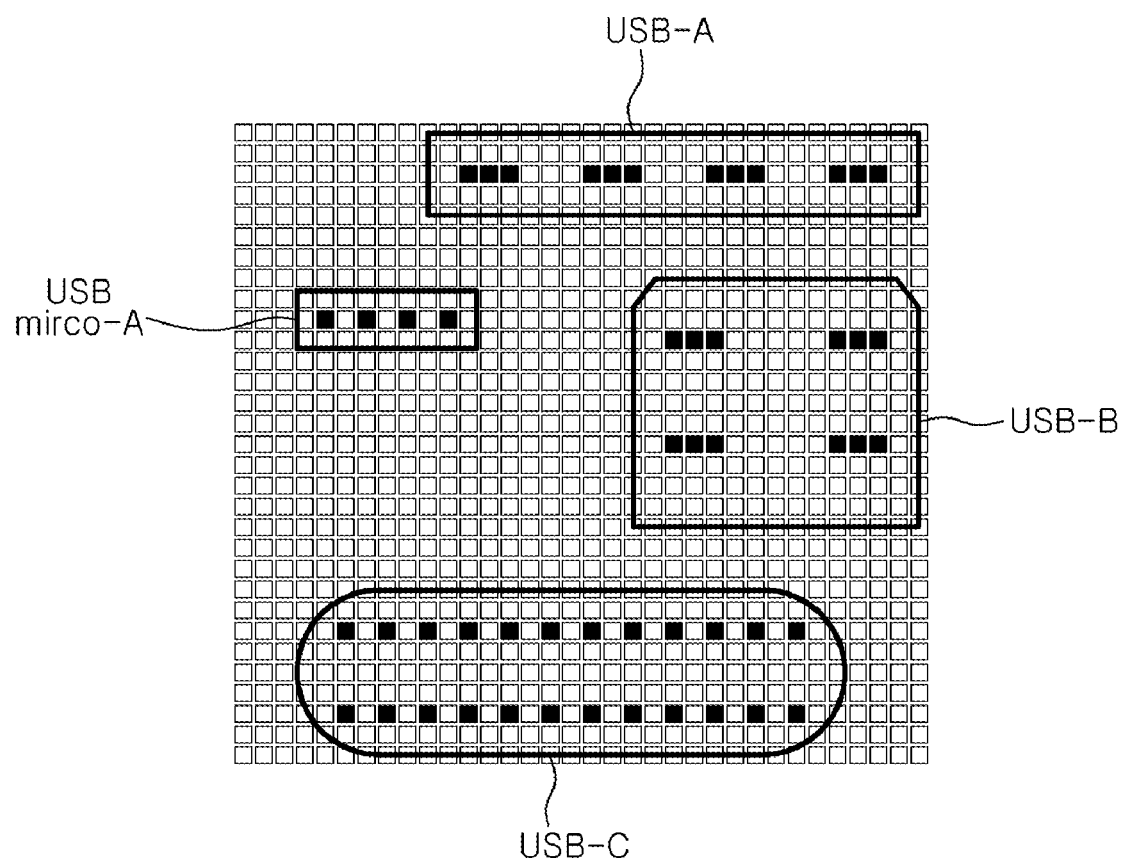
FIG. 10A is an exemplary view showing an exemplary embodiment of the assembly and mounting area in which a USB type connector is combined in the assembly and mounting area configured on the mainboard in the computer automatic assembly system according to the present invention.
Figure 10B:
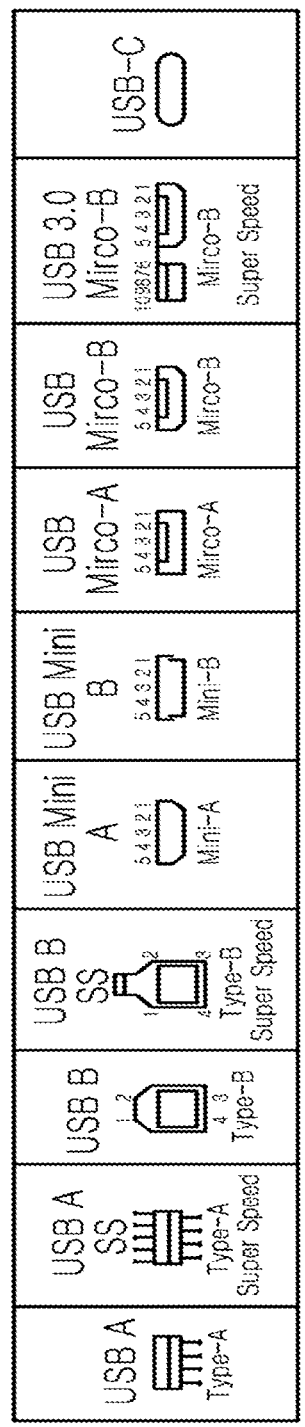
FIG. 10B is an exemplary view showing an internal pin of a disclosed USB connector.

FIG. 10A is an exemplary view showing an exemplary embodiment of the assembly and mounting area in which a USB type connector is combined in the assembly and mounting area configured on the mainboard in the computer automatic assembly system according to the present invention, and FIG. 10B is an exemplary view showing an internal pin of a disclosed USB connector.

As shown in FIG. 10A, a plurality of female pins for coupling are disposed at predetermined intervals at a part mounting position, and the height of the female pin is adjusted through the EDM 130 according to one or more components selected from among the USB connectors shown in FIG. 10B, so that various forms of USB type are able to be combined, and in the above combined state, the USB type is usable by the control of the EDM 130 that receives circuit information for electrical connection of the corresponding USB type from the database.

In addition, the preset USB type may be used at the same time, so as to be connected to the USB devices of various types, thereby having an advantage of maximizing utilization.

Figure 11A:
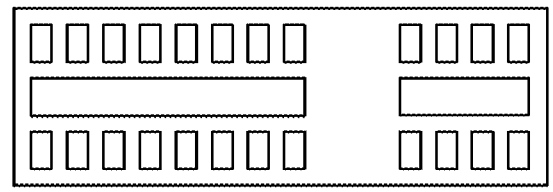
FIGS. 11A-11C are exemplary views showing a female connector provided on a conventional mainboard in which a memory, a graphic card, and a storage are combined.
Figure 11B:
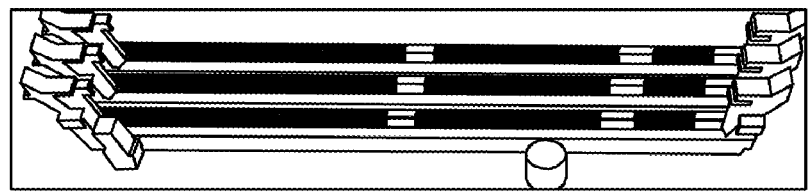
Figure 11C:
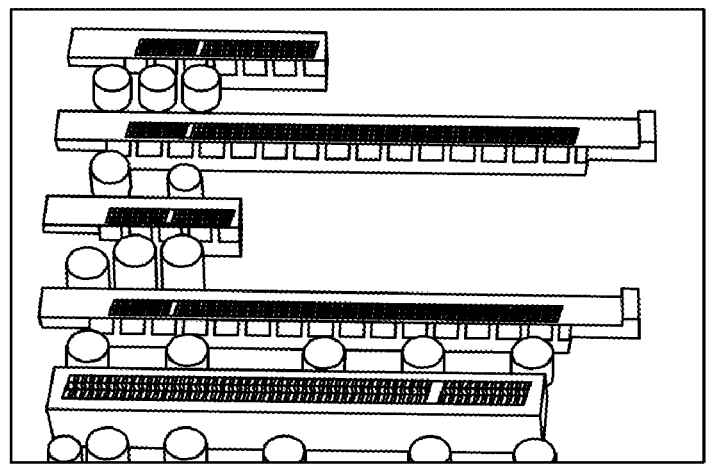

FIGS. 11A-11C are exemplary views showing an exemplary embodiment of an assembly and mounting area in which a memory, a graphic card, and a storage are combined in the computer automatic assembly system according to the present invention. There are provided different configurations for female pin adjusters and female pins, including: a female pin adjuster and a female pin to which a part is combined, the part having a male pin enclosed by an outer housing constituting the part, like parts such as a SATA, a SAS, a USB shown in FIGS. 10A and 10B, or the part being formed to stand upright even when the male pin is put down on a floor; and a female pin adjuster and a female pin to which a part is combined, the part having a male pin exposed to the outside like the memory, graphic card, and storage, or being unable to stand upright when the male pin is put down on a floor.

In other words, for a part that is unable to stand upright when the male pin is placed on the floor, or a part that only a male pin is exposed to the outside like a DIMM, a PCIe, and an NVMe, a female connector of the mainboard fixes the part, and to this end, a conventional female connector is provided with a coupling groove formed for each part to be combined, so that only the compatible part may be combined thereto (refer to FIG. 11A).

The present invention is to solve the above compatibility problem, as shown in FIG. 11B, female pins are successively arranged, and electrical and interface compatibility is provided according to a part, so as to control the part through the robot arm for transfer at only a position where the part is to be combined, thereby combining the part.

Accordingly, the present invention has an advantage of improving user convenience and ease of combination due to the fact that the part may be combined without consideration of compatibility compared to that of the related art where compatibility had to be considered in order to combine the part.

In addition, the database 110 stores information of length and position of a pin according to the type of CPU photographed through the photographing means 160, and in a case where the length of the pin is short when the CPU is mounted on the mainboard, the length of the pin is adjusted according to a CPU slot (i.e., socket) by the pin adjuster, so that the pin is electrically connected to the CPU slot of the mainboard.

In the case of a general mainboard, a socket is provided for combining a central processing unit, but since such a socket is provided by designating the central processing unit supported in a design stage of the mainboard, a socket-type central processing unit that is not supported by the mainboard is unable to be combined. Further, since the mainboard should be replaced in order to replace the central processing unit and replacement of the mainboard requires reconnection of all the expansion devices and storages in use, there is a difficult problem for general consumers to carry out the replacement.

Whereas, in the present invention, in addition to the socket for the central processing unit provided on the mainboard, the area for mounting the central processing unit is provided, the female pin for the central processing unit is arranged in the area, a height of the arranged female pin is adjusted through the pin adjuster, whereby a plurality of central processing units may be mounted on a single mainboard, and operability and compatibility of the added central processing unit mounted in the central processing unit mounting area is implemented through the BIOS, driving driver, and operating program stored in the database.

Therefore, in the case where general consumers and businesses operate servers as well as general computers, when a central processing unit that meets the specifications of a desired target computer is prepared, there are advantages in that the central processing unit may be used by combining to the assembly and mounting area after specifying the central processing unit through photographing by the photographing means, and at this time, the central processing unit may be used immediately without considering compatibility and initial setting for the central processing unit being combined, and it is possible to upgrade or downgrade the computer specifications in the future without much knowledge of the computer.

Obviously, there is an advantage in that the computer specifications desired by the user may be easily implemented by combining a memory, a graphic card, and a storage to the assembly and mounting area, in addition to the central processing unit.

In the present invention as described above, when a user desires to enter the BIOS, it is possible to enter the BIOS by connecting a monitor, a keyboard, and a mouse to the bus controller, whereas when the user does not desire to enter the BIOS, there is no need to wait for a BIOS entry signal because the keyboard, the mouse, and the monitor are connected to a USB port or a user-installed part, and only the necessary information of each device may be called from the database of the DDM, thereby omitting an inspection task for each device.

In addition, all devices receive information necessary for device operation from the DDM, wherein a test procedure including a power on self-test (POST) may be omitted even though there is provided a result of whether to operate the device in the information.

In addition, in the conventional operating system, operators or users have to be directly involved in the booting process of each part (i.e., task that needs to coordinate each part for communication such as link training between the host and the device), and this portion may be omitted because the DDM performs the booting tasks of the parts for the operation test of the parts in advance.

In the present invention, a driver is fetched from the stored hardware information in a boot partition of the operating system in the existing booting system, but in the present invention, the driver is loaded from the DDM.

As described above, the present invention has been described by specific matters such as specific components and limited exemplary embodiments and drawings. However, since these descriptions are only provided to help a more general understanding of the present invention, the present invention is not limited to the above exemplary embodiments, and those skilled in the art to which the present invention belongs can make various modifications and variations from these descriptions.

Therefore, the spirit of the present invention should not be limited to the described exemplary embodiments, and all things equal or equivalent to the claims as well as the claims to be described later fall within the scope of the concept of the present invention.

What is claimed is:

1. A computer assembling system comprising
   a database for storing information on an assembly and mounting area of a computer part including a computer memory which is to be combined to a mainboard, a basic input output system (BIOS), a driving driver, and an operating system, and for periodically updating the information through a communication network;
   a device digestive module for checking the computer part through a photographing means, for moving the computer part to the assembly and mounting area of the computer part positioned on the mainboard through the photographing means and a robot arm, for assembling and mounting the computer part, and for writing a driving program and circuit information of the computer part; and
   an administrator terminal for periodically upgrading or updating information necessary for the device digestive module by communicating with a part manufacturing company server through the communication network,
   wherein the device digestive module comprises an electrical digestion processor configured for receiving the circuit information of the computer part from the database and for writing the received circuit information in the assembly and mounting area of the computer part, and
   wherein the electrical digestion processor is configured to adjust a height of a female pin of the assembly and mounting area through a pin adjuster based on the circuit information of the computer part received from the database such that the female in physically corresponds with a male pin provided in the computer part.

2. The computer assembling system of claim 1, wherein the device digestive module further comprises:
- a controller for controlling operations of a mechanical digestion module (MDM) that controls operation of the robot arm.

3. The computer assembling system of claim 2, wherein the robot arm is configured to transfer the computer part to the assembly and mounting area on the mainboard, assemble and mount the transferred computer part in the assembly and mounting area, photograph a transfer process and an assembly or mounting status through a camera, and transmit the transfer process and the assembly or mounting status to the administrator terminal.

4. The computer assembling system of claim 1, wherein the photographing means comprises:
- a plurality of cameras; and
- a part placement table positioned in a photographing range of each of the plurality of cameras, the computer part being disposed on the part placement table when assembled.

5. The computer assembling system of claim 1, wherein the administrator terminal is an administrator computer capable of performing wired or wireless communication or a smart phone capable of performing the wireless communication.

* * * * *